United States Patent [19]

Dimyan et al.

[11] 4,176,404
[45] Nov. 27, 1979

[54] BUBBLE MEMORY STRUCTURE WITH ENHANCED DATA DENSITY

[75] Inventors: Magid Y. Dimyan; Wayne C. Hubbell, both of Richardson; Christopher T. M. Chang, Dallas; John C. Linn, Richardson, all of Tex.

[73] Assignee: Texas Instruments Incorporated, Dallas, Tex.

[21] Appl. No.: 869,349

[22] Filed: Jan. 13, 1978

[51] Int. Cl.² ............................................. G11C 19/08
[52] U.S. Cl. ...................................... 365/12; 365/15; 365/26; 365/43
[58] Field of Search ....................... 365/12, 15, 26, 39, 365/43

[56] References Cited

U.S. PATENT DOCUMENTS

| 4,014,009 | 3/1977 | Bonyhard et al. | 365/26 |
| 4,133,043 | 1/1979 | Hiroshima et al. | 365/15 |

OTHER PUBLICATIONS

IEEE Transactions on Magnetics -vol. Mag-12, No. 6, Nov. 1976, pp. 614–617.

IEEE Transactions on Computers -Nov. 1975, pp. 1125–1129.

*Primary Examiner*—James W. Moffitt
*Attorney, Agent, or Firm*—Melvin Sharp; Richard L. Donaldson; William E. Hiller

[57] ABSTRACT

A magnetic bubble memory structure having an enhanced storage density is made possible by reducing the circuit period, that is the distance between bubbles, in the storage section of the device. This reduction of the circuit period is made possible by using a gap tolerant propagation element, e.g. asymmetrical chevrons. The bubble storage sections are structured such that the areas closest to the transfer gates have a larger circuit period than the remainder of the storage section. The bubble chip architecture utilizing this means of enhancing the storage density may be of the major-minor loop configuration or the block-replicate configuration. Bubble storage sections in the form of loop structures may have a folded loop or an h loop configuration as well as a closed loop configuration. The reduction in circuit period accomplishes enhancement of the storage density without reducing the bubble diameter and other minimum circuit features to achieve this goal.

22 Claims, 6 Drawing Figures

CIRCUIT PERIOD

DIRECTION OF PROPAGATION

DIRECTION OF PROPAGATION

CIRCUIT PERIOD

BIAS FIELD

DRIVE FIELD

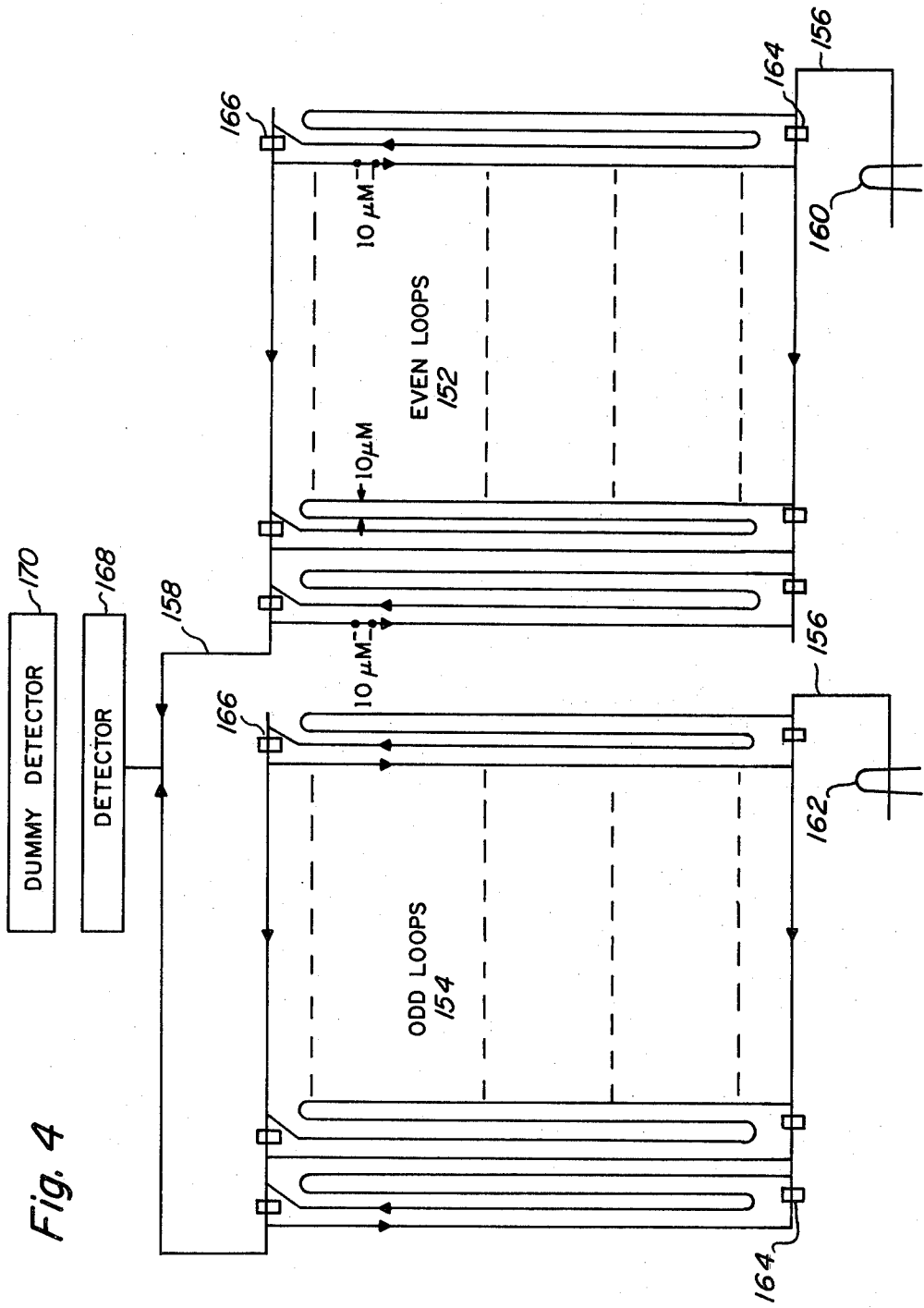

BUBBLE MEMORY STRUCTURE WITH ENHANCED DATA DENSITY

BACKGROUND OF THE INVENTION

This invention relates to a magnetic bubble domain structure and more particularly to a magnetic bubble domain structure having an enhanced storage density area.

In recent years significant interest has developed in a class of magnetic devices generally referred to as magnetic bubble domain devices or "magnetic bubbles". These devices are described, for example, in *IEEE Transactions on Magnetics*, Vol. MAJ-5, No. 3 (1969), pp. 544–553, "Application of Orthoferrites to Domain-Wall Devices". These magnetic domain devices are generally planar in configuration and are constructed of materials which have magnetically easy directions which are essentially perpendicular to the plane of the structure. Magnetic properties such as magnetization and anisotropy, coercivity, and mobility, are such that the device may be maintained magnetically saturated with magnetization in a direction out of the plane, in that small localized single domain regions of magnetic polarization aligned opposite to the general polarization may be supported. Such localized regions which are generally cylindrical in configuration represent binary memory bits. Interest in these devices in large part is based on the high bit density that can be obtained and the ability of the cylindrical magnetic domain to be independent of the boundary of the magnetic material in the plane in which it is formed and to be capable of moving anywhere in the plane of the magnetic material to effect various data processing operations. Since the magnetic bubbles can be propagated, erased, replicated and manipulated in performing a data processing operation and their presence and absence detected, these bubbles may be utilized to perform the primary functions vital to memory operation.

Many structural organizations of operable magnetic domains have been disclosed in the literature. One of the most popular is the major-minor loop memory organization disclosed in U.S. Pat. No. 3,618,054. The major-minor loop memory organization as well as its implementation and operation is well known in the art. The major-minor loop organization includes a closed major loop which typically is established by an arrangement of propagation permalloy elements on, for example, a rare earth garnet film. The magnetic domains are propagated around the loop by in-plane rotating magnetic field action. The major loop is generally elongated to permit a number of minor loops to be aligned along side it. Two-way transfer gates permit the transfer of magnetic domains from each of the minor loops to the major loop and from the major loop to the minor loops. Further access to the major loop is achieved by a detecting read connection thereto and by a separate write connection.

An advance in the sophistication of chip architectures such as the major-minor loop architecture described above includes the "block-replicate" chip architecture which is generally described in an article entitled "64K Fast Access Chip Design" by J. E. Ypma, I. S. Gergis and J. L. Archer appearing in *AIP Conference Proceedings No. 29* Magnetism and Magnetic Material, pp. 51–53 (1975). This type of magnetic bubble domain structure enables faster access to data, by permitting data readout at a rate equal to the field access rate.

Structurally there are three sections to the block replicate chip architecture, the first being an input path, the second a storage section and the third an output path. The input path is associated with generating units to generate magnetic bubble domains to be stored in the storage section which may include a plurality of loop structures. The output path is associated with detector units and replicate gates for replicating the magnetic bubbles in the storage region by splitting the bubble into two sections and retaining one section in its virtual position in the storage section while transferring the second bubble into the output path to be moved to a detector unit. The storage section may be separated into an odd and even plurality of loops so as to permit alternating read out of data from the odd and even loops by the detector at a rate equal to the field rate of the device.

In both of the architecture structures described above, propagation elements made of permalloy material make up the propagation paths and storage sections. There are two basic types of circuit propagation element structures commonly employed in a magnetic bubble domain device. The first such structure comprises alternating T and bar-shaped elements, i.e. the so-called T-bar configuration, and the second structure comprises chevron elements. In the T-bar form of propagation elements, several characteristics occur that are limiting in nature. The first of these characteristics is the small gap between successive T and bar elements which inhibits further reduction in the size of these elements based on the present state of the optical lithography art. A second characteristic that is limiting for T-bar circuits is shape anisotropy causing the bars of permalloy to be amenable to strong bubble-bubble interaction. In forming a loop structure using T-bar permalloy elements, the loops are interconnected with the bar element thus enhancing the possibility of further bubble-bubble interaction.

The chevron-shaped elements comprising the second common type of circuit propagation element structures are gap tolerant elements. Where the chevron type elements are employed, the gaps between successive chevron elements may be designed to a greater value than possible with the T-bar structure. The chevron element is a single element structure which does not require interconnection between loops. These characteristics minimize any bubble-bubble interaction.

A magnetic drive field within the plane of the layer of magnetic material is rotated which causes the individual propagation elements, T-bar or chevron type, in the patterned bubble propagation paths to be sequentially polarized in a cyclical sequence causing the individual bubble domains to be propagated in a step wise movement along the path as defined by the magnetizable propagation elements. A bias magnetic field is also present which sustains the character of the bubble domain. An extreme increase in the bias field will cause the bubble domains to collapse and thus the reliability as a memory device depends upon control of the bias field. A bias field that is too low will cause a stripout phenomenon in which the bubble will elongate and thus become unusable. The point above the stripout field amplitude is that point at which a bubble will come into existence. A measurement of the bias field as a function of the drive field can be defined as a propagation margin and monitored at a variety of areas on the magnetic layer. The propagation margin is in actuality the difference between the collapse field and the stripout field as a function of the drive field. A magnetic domain structure is designed such that it will utilize the greatest propagation margin available considering the other functional limitations of the device, including replicating, transferring or detecting magnetic bubbles. The propagation margin when measured along the straight line of a loop structure found in the bubble storage section of a major-minor loop architecture or block replicate architecture has a value greater than the margin of the entire system. The optimum device will have a propagation margin such that the operating magnetic field will have a plus or minus variance between collapse and stripout large enough such that continuous operation in a reliable manner can be performed.

One of the main reasons for the interest in magnetic bubble domain structures is their potential for greater storage density. Neighboring bubbles are usually separated by 4.5–5.5 times the nominal bubble diameter, the average bubble size at the operating range of the bias field, in order to minimize the effect of bubble-bubble interaction which tends to reduce the propagation margins. Designing circuits with large bubble separating distances known as the circuit period is especially important with T-bar circuits mainly because margins are quite poor in the first place and also because adjacent tracks are normally connected as described above. In the gap tolerant structures, e.g. asymmetrical chevron type propagation elements, the margins are typically about 20% of bubble collapse for circuits in which the period is approximately 5 bubble diameters.

The goal in any memory device is to enhance the storage data capability of the structure. In the magnetic bubble memory device, one possibility of enhancing the storage capability would be to reduce the bubble size. However, it has been found that reduction of the bubble size enhances step coverage problems and is further limited by the state of the art of bubble materials, device processing, optical lithography, etc.

SUMMARY OF THE INVENTION

In accordance with the present invention, a magnetic bubble domain memory structure is provided having an enhanced storage density capability. The magnetic bubble domain structure includes a layer of magnetic material in which magnetic bubbles can be moved, and having an overlay pattern of a permalloy material disposed thereon, wherein the overlay pattern comprises a plurality of propagation elements for guiding the magnetic bubble domains in the layer of magnetic material. The propagation elements may take the form of T-bar circuits or chevron type, gap tolerant, propagation circuits. A plurality of bubble propagation paths including a bubble domain storage section are provided. In the bubble domain storage section, those parts of the storage section used for input and output to and from the storage section have successive individual propagation elements with a greater separating distance therebetween as compared to the separating distance between successive individual propagation elements forming the remainder of the storage section. The chip architectures available for use with the enhanced-density storage section include a major-minor loop architecture and a block replicate architecture. The major-minor loop architecture may take the form of essentially two separate devices having interleaved minor loops with individual propagation elements having a smaller circuit period in the minor loops. In the block replicate device, the enhanced-density bubble storage section may include an elongated closed loop that is folded between the input path and output path or in the alternative a closed loop in an h configuration.

BRIEF DESCRIPTION OF THE DRAWINGS

FIG. 4 is a schematic diagram of a magnetic bubble memory structure in a block-replicate configuration having folded storage loops with circuit periods in accordance with the present invention.

DETAILED DESCRIPTION OF THE DRAWINGS

Figure 1A:
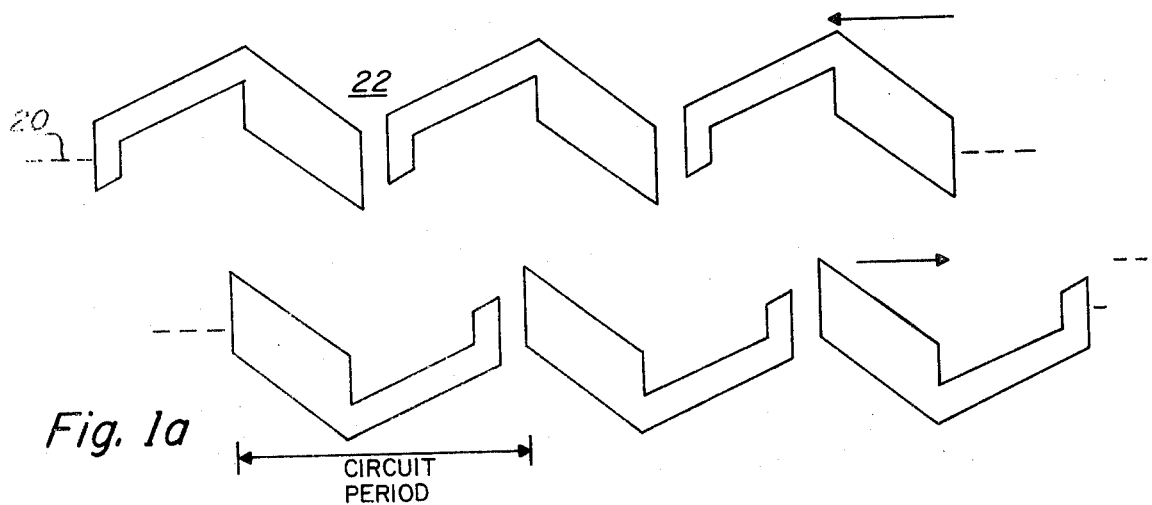
FIGS. 1a and 1b are schematic diagrams of magnetic bubble domain propagation elements depicting T-bar and chevron elements respectively.
Figure 1B:
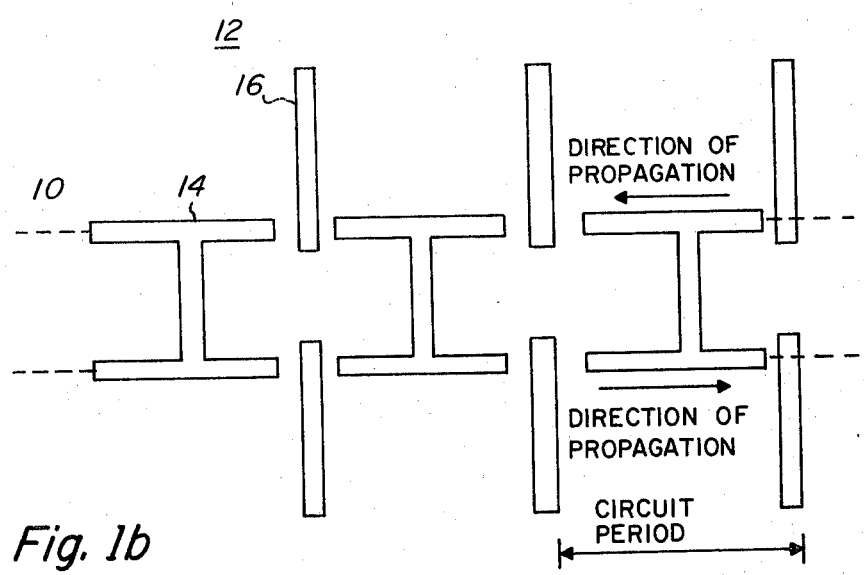

Referring now to the figures and more particularly to FIGS. 1a and 1b, individual propagation elements are shown in the form of T-bar propagation elements and chevron or gap tolerant propagation elements respectively. In FIG. 1a, a single loop 10 of a magnetic bubble domain structure described herein comprises a series of alternating T elements 14 and bar elements 16. The bar elements 16 respectively guide bubbles from one T element to a successive T element and further interconnect adjacent loops. Rotation of the in-plane magnetic field causes the magnetic bubble domains to move along the guidelines of the individual propagation elements which as in the case of FIG. 1a is a loop structure formed of T-bar propagation elements. The distance between the same position on separate propagation elements on which bubbles are disposed is defined as a circuit period of the magnetic bubble storage loop. In a T-bar design, the circuit period must have a large value, the reason being due to shape anisotropy there tends to be a greater bubble-bubble interaction thus the need for a larger distance between adjacent propagation elements is evident.

FIG. 1b illustrates a plurality of chevron propagation elements 22 arranged in a loop configuration 20. Each of the chevron elements 22 is a unitary structure enabling a magnetic bubble to be moved from element to element while undergoing a minor stripout phenomenon between elements in response to the rotating in-plane magnetic field. As shown, the chevron elements 22 are of the so-called asymmetric type in that one of the two wings of each respective element has a notch formed therein. The circuit period of the chevron element is also defined as that distance between the same location on adjacent chevron elements. Considering each side of the loop to be an individual course or track, in a chevron designed loop structure there is no interaction between courses or tracks since there is no interconnecting bar element as in a T-bar circuit. This reduces bubble-bubble interaction between elements and further allows for a smaller distance between adjacent chevron elements on the same course or track. Accordingly, the chevron elements 22 may be said to be gap tolerant propagation elements.

Considering the limitations of the T-bar propagation elements shown in FIG. 1a and the characteristics of the chevron elements illustrated in FIG. 1b, it can be observed that there is the possibility in the design of a loop structure using chevron circuit elements to reduce the circuit period by reducing the distance between chevron elements and still avoid any major problems with bubble-bubble interaction. This reduction in circuit period allows for a greater bubble density within the storage area of the loop structure. However, in those areas of magnetic bubble domain structure where bubble domain transfer and replicate functions occur requiring a control conductor to be placed under the permalloy material, a reduction in circuit period gives rise to a number of problems. Examples of these problems are electromigration where a fixed current is needed to perform transfer and replicate functions, and further, resolution problems wherein the minimum feature size of the conductor material is reduced to such an extent that it falls outside the permissible limits of optical lithographic techniques. At the corner or light areas of the loops where the transfer and replicate functions take place the permalloy is located at a larger spacing from the liquid phase epitaxial layer wherein a magnetic force is created. Therefore, due to the conductor under the gate there is the need for a greater magnetostatic energy that is, a greater magnetic force created by the drive field to overcome this spacing. Considering the other problems of electromigration and resolution along with the need for this greater magnetic force prohibits the reduction of the circuit period of the individual propagation elements at and near the corner or bight regions of the loop structures.

Figure 2:
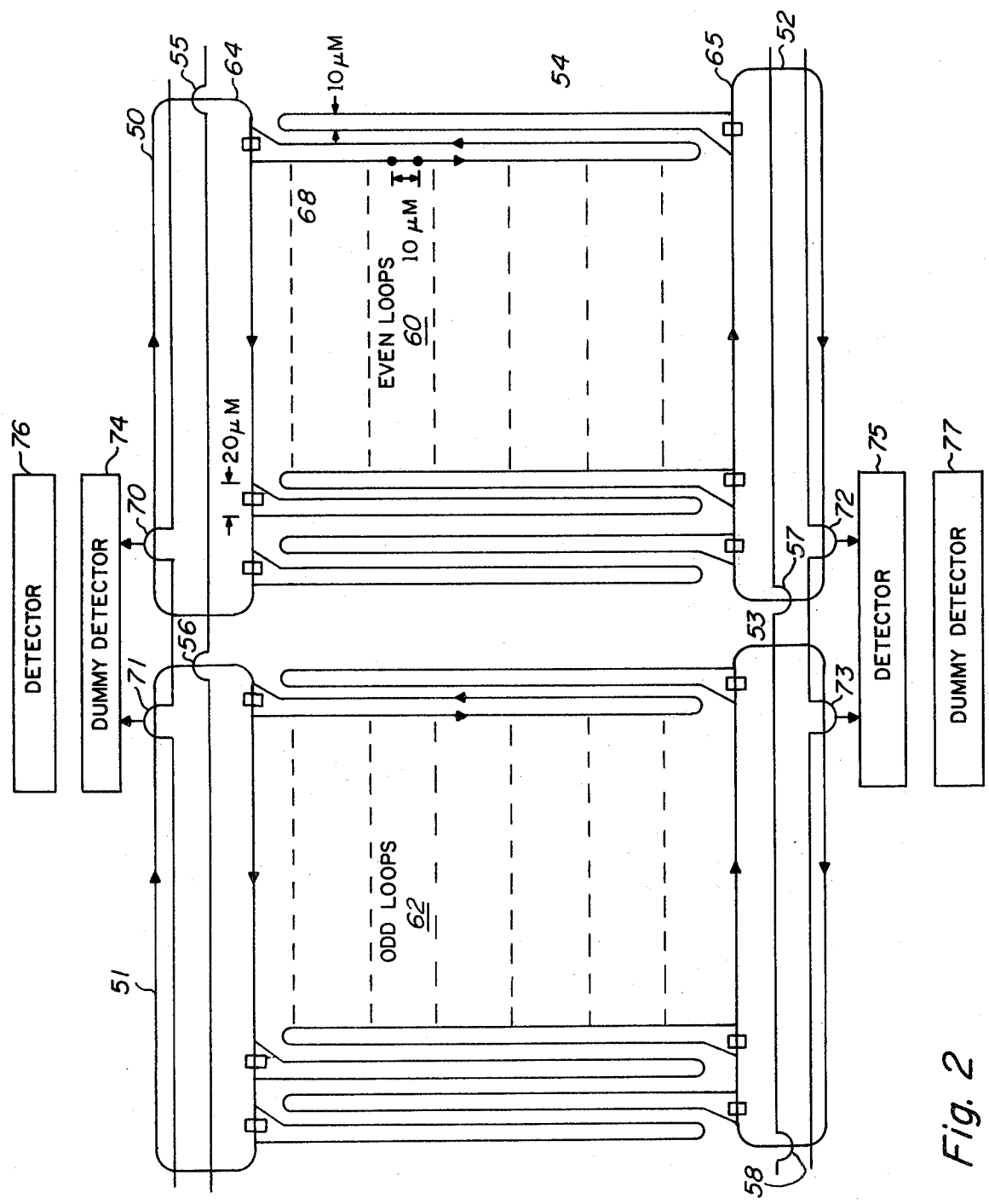
FIG. 2 is a schematic diagram of a magnetic bubble memory chip having a major-minor loop configuration, wherein the minor loops are formed by propagation elements having a circuit period relationship in accordance with the present invention.

Referring now to FIG. 2, a major-minor loop magnetic bubble domain structure wherein the magnetic bubble domain storage regions have an enhanced density capability is illustrated. In a typical major-minor loop design, a major propagation path is associated with a plurality of minor loops arranged along one or both sides of the major propagation path and constituting a bubble storage region. Generator elements and detector elements are associated with the major propagation path, and transfer gates are disposed between the major propagation path and each of the minor loops. However, in the embodiment shown in FIG. 2, a plurality of major propagation paths 50-53 are provided, the major propagation paths being located on a magnetic layer such that a first pair of major propagation paths 50 and 52 are oppositely disposed to one another in spaced apart relationship, and a second pair of major propagation paths 51 and 53 are likewise oppositely located.

Generators 55-58 are located adjacent to and operably associated with respective ones of the major propagation paths 50-53. First and second bubble storage sections 60 and 62 are respectively interposed between the major propagation paths comprising the first and second pairs of major propagation paths 50,52 and 51,53. Each of the bubble storage sections 60 and 62 comprises a plurality of interleaved minor loop structures alternately originating from the opposed major propagation paths of the corresponding pair of major propagation paths 50,52 and 51,53. Thus, one bight or end region of each minor loop is disposed in proximate relation to a corresponding major propagation path, and the other bight or end region of the minor loop is spaced from the other major propagation path of the pair of major propagation paths between which the minor loop is interposed. Respective sets of two-way transfer gates 64-67 are disposed between the major propagation paths 50-53 and the bight or end regions of the minor loops which are in proximate relation thereto. Therefore, it will be understood that one-half of the minor loops included in the first bubble storage section 60 are adapted to exchange data (i.e. chains of bubbles representing binary "1's" and/or voids representing binary "0's") with the major propagation path 50 via the transfer gates 64, and the remaining one-half of the minor loops in the first bubble storage section 60 are adapted to exchange data with the major propagation path 52 via the transfer gates 66. A similar relationship exists between the minor loops included in the second bubble storage section 62, the second pair of major propagation paths 51,53 and the sets of transfer gates 65 and 67. The major propagation paths 50-53 and the interleaved minor loop structures comprising the storage sections 60 and 62 are formed by individual propagation elements such as those shown in FIGS. 1a and 1b and described above. Each of the minor loop structures comprising the respective bubble storage sections 60 and 62 is a non-uniform loop, that is, the distance between individual courses or tracks forming the loop are not equi-distant throughout the loop. More specifically, the circuit periods of the individual propagation elements comprising the loop structures are of a lesser value in the straight line area of the loop and of a greater value in the bight or end proximate to a major propagation path and associated with a transfer gate. A typical circuit period in the straight line section of the loop structure 68, for example, is 10 microns for 3 μm bubble diameters. This distance in essence is the distance separating the magnetic bubble domains on the individual tracks. A circuit period defined separating bubbles on a track is called the x period of the magnetic bubble domain loop structure while the distance separating loops is referred to as the y period and is of a substantially same value. However, the circuit period or distance between propagation elements defining the bight or end regions of the loop structure proximate to a major propagation path is of a greater value, thereby increasing the y period at the bight regions associated with transfer gates to approximately 20 microns or double that of the circuit period in the straight line area of the loop structure 68.

Also connected with the major propagation paths 50-53 are replicator gates 70-73. The replicator gates 70-73 split the magnetic domains propagating on the major propagation paths 50-53 respectively to form two bubbles, with one of the split magnetic bubble domains being transferred to a detector 74 for those bubbles on major propagation paths 50 and 51 and to a detector 75 for those bubbles propagating on major propagation paths 52 and 53. The second bubble is returned to the same minor loop included in one of the bubble domain storage sections 60 and 62 by way of a corresponding transfer gate 64-67 from which the original bubble was output to the respective major propagation path. Second detectors 76 and 77 may be connected to detectors 74 and 75 respectively to sense and eliminate any noise in the system. It will be understood, therefore, that each of the major propagation paths 50-53 comprises a read/write track in the form of an endless loop.

Operationally, when a magnetic bubble domain is generated at any of generators 55-58, the bubble domain will propagate in one of the respective major propagation paths 50-53 (which serves as a "write" track in this cycle) and be transferred into the appropriate one of the bubble domain storage sections 60 and 62 by way of transfer gates 64-67. Each of the plurality of interleaved loop structures forming the first and second bubble domain storage sections 60 and 62 has reduced circuit periods in the straight line section of the loop structure as previously described such that the circuit period for those propagation elements adjacent to the transfer gates is greater than the straight regions, thereby enabling a greater density of magnetic bubble domains to be stored in the bubble storage sections 60 and 62 than heretofore possible. When reading data out of the magnetic bubble domain structure of FIG. 2, the magnetic bubble domains are transferred out of the individual minor loops included in the bubble storage sections 60 and 62 by way of respective transfer gates 64-67 onto the corresponding major propagation paths 50-53, respectively (which serve as "read" tracks in this cycle). The magnetic bubble domains then propagate around the major propagation paths 50-53 to the replicator gates 70-73, respectively. Each magnetic bubble domain is then split into two bubbles as described above, with one of these bubbles being sensed by the corresponding one of the detector units 74 and 75 for readout, and the remaining bubble being returned to the same minor loop from which it came to preserve the data intact.

This form of architecture enables two bits of data to be read out for each cycle (one bit by the detector 74 and the second bit by the detector 75), thereby doubling the data readout rate as compared to the data input rate. In addition, data storage density is substantially increased as contrasted to conventional major-minor loop architectures, being of the order of more than 250% greater data storage density as achieved by the variation in the circuit periods as between the straight regions and the bight regions proximate to a major propagation path for each of the plurality of minor loops included in the first and second bubble storage sections 60 and 62.

Figure 3:
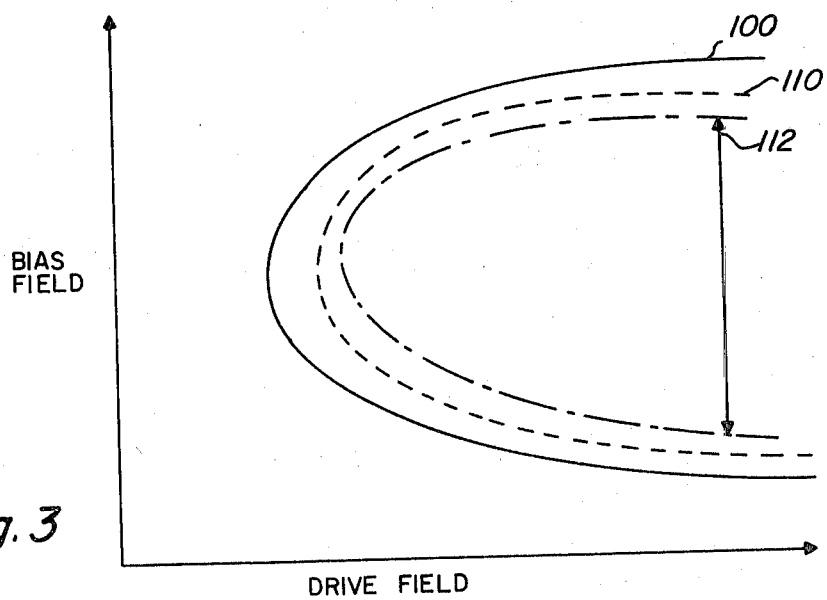
FIG. 3 is a graph showing the propagation margin of a magnetic bubble domain structure.

The propagation margin for a magnetic bubble domain structure is the difference in the collapse field and stripout field, which are values of the magnetic bias field of the device. FIG. 3 shows a series of curves representing typical propagation margins for a magnetic bubble domain device. Curve 100 is representative of the propagation margin in the straight line segment of a loop structure such as the loop structure 68 shown in the magnetic bubble domain structure of FIG. 2. In this section of the loop structure using uniform circuit periods for individual propagation elements throughout the loop will yield the greatest propagation margin in the device. Curve 110 represents a propagation margin considering the gate region problem with the conductor beneath the gate as described above. Curve 112 illustrates a composite propagation margin for the device which includes the detector, swap or transfer replicate gates, and generators, etc. As is readily seen from the graph, the propagation margin in the straight line segments of the loop structures is not effectively utilized since the composite margin remains significantly less due to limits placed on the structure by other restrictive elements or functions in the device itself. Therefore, a decrease of the propagation margin in the straight line section by reducing the circuit period of the propagation elements within that straight line segment will not reduce the overall composite margin of the device and will enable the storage density of the bubble storage sections of the device to be increased.

FIG. 4 is a further illustration of enhanced storage density in a magnetic bubble memory structure. In FIG. 4, a block-replicate architecture having a bubble input section, a bubble output section, an an intermediate bubble storage section disposed between the bubble input section and the bubble output section is utilized. The bubble storage section comprises first and second magnetic bubble memory storage sections 152 and 154, each of which includes a plurality of minor bubble propagation paths in the form of individual closed bubble storage loops. The bubble input section comprises a pair of major propagation paths 156,156 arranged in a tandem configuration, with each major propagation path including respective bubble generators 160 and 162 thereon. The bubble output section comprises a pair of major propagation paths 158, 158 arranged in end-to-end relation and merging to form a single propagation path 159 comprising an input to a bubble detector 168.

The plurality of elongated loop structures defining the respective bubble memory storage sections 152 and 154 are formed in such a manner that each loop is folded into two telescoped sections so as to fit between a corresponding major propagation path 156 of the input section and a corresponding major propagation path 158 of the output section. A plurality of transfer gates 164 which may be in the form of swap gates of a type disclosed in pending U.S. application, Ser. No. 783,996, filed Apr. 4, 1977, for example, are operably interconnected with the storage loops of the first and second bubble memory storage sections 152 and 154 and the respective major propagation paths 156,156 of the bubble input section by virtue of control lines (not shown) leading to a pulse generator (not shown). Data exchange from the bubble input section to the bubble storage sections 152 and 154 via the transfer gates 164 is effected by appropriatelly pulsing the control lines. Where the transfer gates 164 are swap gates, old data from the bubble storage sections 152 and 154 may be simultaneously transferred via the gates 164 from the storage loops of the bubble storage sections 152 and 154 to the bubble input section for subsequent annihilation. Similarly, a plurality of replicate/transfer gates 166 are operably interconnected with the storage loops of the first and second bubble memory storage sections 152 and 154 and the respective major propagation paths 158,158 of the bubble output section. The replicate/transfer gates 166 are arranged at the ends of the storage lops opposite from the transfer gates 164 and are associated with control lines (not shown) leading to the pulse generator for activation upon appropriate pulsing of the control lines.

Each of the storage loop structures forming the bubble domain storage sections 152 and 154 are non-uniform in that the circuit period between individual propagation elements forming the loop structures are greater in those regions adjacent to the replicate gates 166 and the transfer gates 164 as compared to the circuit period between individual propagation elements defining the remainder of the loop structures. This configuration enables an enhanced storage density to be achieved within the bubble domain storage sections 152 and 154 while retaining the greater circuit periods for those problem areas in the replicate gate and transfer gate regions, 166 and 164 respectively.

Operationally, the generators 160 and 162 may selectively produce bubble domains in response to each complete rotation of the in-plane magnetic field which are then propagated along the major propagation paths 156,156 of the input section to transfer gate regions 164. The magnetic bubble domains may then be transferred into bubble storage regions 152 and 154. To read data out of the memory structure, the bubble domains stored in the storage loops of storage sections 152 and 154 are replicated at the respective replicate gates 166 and propagated along the major propagation paths 158,158 of the output section. By reading the bubble domains out of the storage regions 152 and 154 on alternating cycles of the rotating in-plane magnetic drive field, the propagating bubbles will arrive at the detector 168 via the merge path 159 in a fashion enabling the sensing of the bubbles at a rate equal to the field rate of the device. A second dummy detector 170 may perform in combination with the detector 168 to eliminate any noise in the system.

Figure 5:
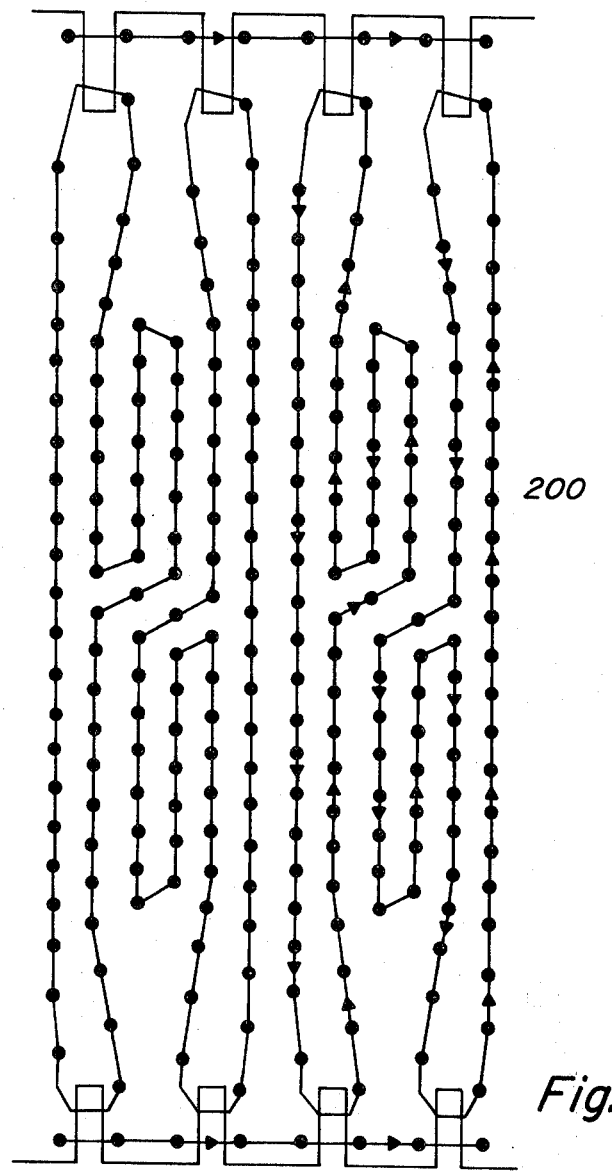
FIG. 5 is a schematic diagram of a magnetic bubble domain storage section in the form of an h loop configuration having a circuit period relationship in accordance with the present invention.

FIG. 5 illustrates an alternative loop structure 200 that may be utilized in a magnetic bubble domain architecture of the type shown in FIG. 4. The loop structure 200 is in an h configuration where due to the reduction in the circuit period in the straight line segments of the loop structure and the larger circuit period between propagation elements located in the regions adjacent to the transfer and replicate gates enable one and one-half loops to be stored in the same amount of space previously required for one loop using a uniform circuit period between the successive individual propagation elements throughout the loop structure.

Although the present invention has been described in relation to specific embodiments, it should be apparent to those skilled in the art that various modifications may be made without departing from the spirit and scope of the present invention.

What is claimed is:

1. A magnetic bubble memory structure comprising:
   a planar layer of magnetic material in which magnetic bubbles can be moved,
   an overlay pattern of magnetically soft material disposed on a major surface of said planar magnetic layer and defining bubble domain propagation paths of individual propagation elements for guiding the movement of said bubbles in said layer in response to a change in orientation of a rotary magnetic field within the plane of said layer,
   said bubble domain propagation paths including a magnetic bubble domain storage section for said magnetic bubble domains,
   transfer gate means located adjacent to said magnetic bubble domain storage section for transferring magnetic bubble domains out of said bubble domain storage section, and
   said bubble domain storage section comprising a plurality of individual propagation elements prearranged to form individual tracks interconnected to form a loop structure wherein a circuit period defining a predetermined distance between propagation elements in said tracks is such that said propagation elements adjacent to said transfer gate means are separated by a greater circuit period than the propagation elements forming the remainder of said bubble domain storage section.

2. A magnetic bubble domain structure as set forth in claim 1, further including generator means operably associated with said bubble domain propagation paths for generating magnetic bubble domains.

3. A magnetic bubble domain structure as set forth in claim 1 further including detector means operably associated with said bubble propagation paths for sensing the presence and absence of magnetic bubble domains.

4. A magnetic bubble domain structure as set forth in claim 1, wherein said bubble propagation paths include a major propagation path operably associated with said bubble storage section.

5. A magnetic bubble domain structure as set forth in claim 1, wherein said bubble propagation paths include input and output paths located adjacent to said bubble storage section and at opposite ends thereof for moving magnetic bubble domains into and out of said bubble storage section.

6. A magnetic bubble domain structure as set forth in claim 1, wherein said individual propagation elements are gap-tolerant propagation elements.

7. A magnetic bubble domain structure as set forth in claim 1, wherein said individual propagation elements are chevron propagation elements.

8. A magnetic bubble domain structure as set forth in claim 3, wherein said transfer gate means comprises a swap transfer/replicate gate being operable in a swap transfer mode and a replicate mode in response to respective energy pulses of predetermined differing magnitudes, said swap transfer/replicate gate being operable in a swap transfer mode to simultaneously transfer data as represented by magnetic bubbles and voids from said propagation paths to said bubble storage section and from said bubble storage section to said propagation paths, and said swap transfer/replicate gate being operable in its replicate mode to split respective magnetic bubbles incident thereon from said bubble storage section so as to form a replicate magnetic bubble in addition to the original magnetic bubble for transferring one of the two bubbles from said bubble storage section for delivery to said detector means for readout while retaining the other bubble in the same virtual position in said bubble storage section.

9. A magnetic bubble domain structure comprising:
   a planar layer of magnetic material on which magnetic bubbles can be moved,
   an overlay pattern of magnetically soft material disposed on a major surface of said planar magnetic layer and defining first and second major propagation paths and first and second bubble storage sections respectively operably associated with said first and second major propagation paths,
   said first and second major propagation paths and said first and second bubble storage sections comprised of individual propagation elements for guiding the movement of said magnetic bubbles in said layer in response to a change in orientation of a rotary magnetic field within the plane of said layer,
   first transfer gate means disposed between said first major propagation path and each of said first and second bubble storage sections, second transfer gate means disposed between said second major propagation path and each of said first and second bubble storage sections, for transferring magnetic bubble domains from said first and second storage sections to said first and second major propagation paths respectively,
   said first and second bubble storage sections comprising a plurality of individual propagation elements prearranged to form individual tracks interconnected to form a loop structure wherein the circuit period defining a predetermined distance between individual propagation elements located within said tracks is such that said individual propagation elements adjacent to said first and second transfer gate means are separated by a greater circuit period than the propagation elements forming the remainder of said first and second bubble storage sections, and said first and second bubble storage sections each having a plurality of loops interleaved with one another and separated by said circuit period and having said first and second major propagation paths located at opposite ends thereof.

10. A magnetic bubble domain structure as set forth in claim 9 further including first and second generator means operably associated with said first and second major propagation paths respectively for generating magnetic bubble domains.

11. A magnetic bubble domain structure as set forth in claim 9 further including first and second detector means operably associated with said first and second major propagation paths respectively for sensing the presence and absence of magnetic bubble domains.

12. A magnetic bubble domain structure as set forth in claim 11, wherein said first and second transfer gate means comprise a swap transfer/replicate gate being operable in a swap transfer mode and a replicate mode in response to respective energy pulses of predetermined differing magnitudes, said swap transfer/replicate gate being operable in a swap transfer mode to simultaneously transfer data as represented by magnetic bubbles and voids from said first and second major propagation paths to said first and second bubble storage sections and from said first and second bubble storage sections to said first and second major propagation paths, and said swap transfer/replicate gate being operable in its replicate mode to split respective magnetic bubbles incident thereon from said first and second bubble storage sections so as to form a replicate magnetic bubble in addition to the original magnetic bubble for transferring one of the two bubbles from said first and second storage sections for delivery to said first and second detector means for readout while retaining the other bubble in its same virtual position in said first and second bubble storage sections.

13. A magnetic bubble domain structure as set forth in claim 11, further including a plurality of first and second major propagation paths operably associated with said first and second bubble storage sections having interleaved loops such that said first and second major propagation paths are oppositely disposed and said plurality of first and second major propagation paths being operably associated with one another such that said plurality of said first and second major propagation paths are interconnected to said first and second detector means for collectively delivering data in the form of a series of magnetic bubbles and voids.

14. A magnetic bubble domain structure as set forth in claim 9, wherein said individual propagation elements are gap-tolerant propagation elements.

15. A magnetic bubble domain structure as set forth in claim 9, wherein said individual propagation elements are chevron propagation elements.

16. A magnetic bubble domain structure comprising:

a planar layer of magnetic material in which magnetic bubbles can be moved, an overlay pattern of magnetically soft material disposed on a major surface of said planar magnetic layer and defining bubble propagation paths including an input propagation path, an output propagation path located opposite to said input propagation path, and first and second bubble storage sections disposed between said input and output bubble propagation paths, transfer gate means disposed between said input propagation path and said first and second bubble storage sections for transferring magnetic bubble domains into said first and second storage sections, replicate gate means disposed between said output path and said first and second bubble storage sections for splitting respective magnetic bubbles incident thereon so as to form a replicate magnetic bubble in addition to the original magnetic bubble for transferring one of the two bubbles from the corresponding one of said first and second storage sections to said output path, said first and second bubble storage sections comprising a plurality of individual propagation elements prearranged to form individual tracks interconnected to form a loop structure wherein the circuit period defining a predetermined distance between individual propagation elements located within said tracks is such that said individual propagation elements adjacent to said transfer gate means and said replicate gate means are separated by a greater circuit period than individual propagation elements in the tracks forming the remainder of said first and second bubble storage sections.

17. A magnetic bubble domain structure as set forth in claim 16 further including generator means operably associated with said input propagation path for generating magnetic bubble domains.

18. A magnetic bubble domain structure as set forth in claim 16 further including detector means operably associated with said output propagation path for sensing the presence and absence of said magnetic bubble domains.

19. A magnetic bubble domain structure as set forth in claim 16, wherein said individual propagation elements are gap-tolerant elements.

20. A magnetic bubble domain structure as set forth in claim 16, wherein said individual propagation elemnts are chevron elements.

21. A magnetic bubble domain structure as set forth in claim 16, wherein said loop structures of said first and second bubble storage sections are elongated such that each of said loops is folded into first and second folds between said input and output propagation paths and having said first fold separated from said second fold by said circuit period.

22. A magnetic bubble domain structure as set forth in claim 16, wherein alternating loop structures of said first and second bubble storage sections comprise a continuous series of said individual propagation elements aligned in an h configuration having the alternate loop structure in an inverse h configuration.

* * * * *